(12) United States Patent
Leidich et al.

(10) Patent No.: US 10,330,498 B2
(45) Date of Patent: Jun. 25, 2019

(54) SENSOR ARRANGEMENT FOR THE CONTACTLESS SENSING OF ANGLES OF ROTATION ON A ROTATING PART

(71) Applicant: Robert Bosch GmbH, Stuttgart (DE)

(72) Inventors: Stefan Leidich, Rutesheim (DE); Ralf Ameling, Aalen (DE)

(73) Assignee: Robert Bosch GmbH, Stuttgart (DE)

( * ) Notice: Subject to any disclaimer, the term of this patent is extended or adjusted under 35 U.S.C. 154(b) by 113 days.

(21) Appl. No.: 15/517,344

(22) PCT Filed: Sep. 29, 2015

(86) PCT No.: PCT/EP2015/072370
§ 371 (c)(1),
(2) Date: Apr. 6, 2017

(87) PCT Pub. No.: WO2016/055301
PCT Pub. Date: Apr. 14, 2016

(65) Prior Publication Data
US 2017/0292857 A1 Oct. 12, 2017

(30) Foreign Application Priority Data
Oct. 9, 2014 (DE) .................. 10 2014 220 454

(51) Int. Cl.
G01D 5/20 (2006.01)
G01R 27/26 (2006.01)
G01P 3/44 (2006.01)

(52) U.S. Cl.
CPC .......... *G01D 5/202* (2013.01); *G01R 27/2611* (2013.01); *G01P 3/44* (2013.01); *G01R 27/267* (2013.01)

(58) Field of Classification Search
CPC .... G01D 5/202; G01D 5/2073; G01D 5/2093; G01R 19/00; G01R 27/00; G01R 27/02;
(Continued)

(56) References Cited

U.S. PATENT DOCUMENTS 6,236,199 B1 * 5/2001 Irle .................. G01D 5/2093
324/207.17
2001/0004849 A1 * 6/2001 Jin .................. G01D 5/2451
73/862.331
(Continued)

FOREIGN PATENT DOCUMENTS

CN 101137892 A 3/2008
CN 101363710 A 2/2009
(Continued)

OTHER PUBLICATIONS

International Search Report corresponding to PCT Application No. PCT/EP2015/072370, dated Jan. 21, 2016 (German and English language document) (5 pages).

*Primary Examiner* — Hoai-An D. Nguyen
(74) *Attorney, Agent, or Firm* — Maginot, Moore & Beck LLP (57) ABSTRACT

In one embodiment, a sensor arrangement for the contactless sensing of angles of rotation on a rotating part includes a disk-shaped target, a coil arrangement, and an evaluation and control unit. The disc-shaped target is coupled to the rotating part and includes at least two metal surfaces that influence the inductances in the flat detection coils due to eddy current effects as a function of the degree of overlap. The disc-shaped target can generate at least one piece of information for ascertaining the instantaneous angle of rotation of the rotating part, in connection with the coil arrangement. The coil arrangement has three flat detection coils uniformly distributed on the circumference of a circle. The evaluation and control unit can generate essentially sinusoidal evaluation signals which represent the changes in inductance of the detection coils and can evaluate them for calculating the angle of rotation.

18 Claims, 4 Drawing Sheets

(58) Field of Classification Search
CPC ............... G01R 27/26; G01R 27/2611; G01R
27/2617; G01R 27/2635; G01R 27/267;
G01P 3/00; G01P 3/42; G01P 3/44; H01G
5/00; H01G 5/04; H01G 5/06; H01G 5/10
USPC ............ 324/207.11, 207.13, 207.15, 207.16,
324/207.17, 207.22, 207.23, 207.25, 600,
324/629, 631, 649, 654, 76.11, 76.77, 86,
324/137, 154 R; 73/114.01, 114.26;
310/10, 40 R, 114; 340/671, 672;
361/298.1; 702/127, 142, 145, 150, 151
See application file for complete search history.

(56) References Cited

U.S. PATENT DOCUMENTS

| | | | | |
|---|---|---|---|---|
| 2002/0118013 | A1* | 8/2002 | Kowalski | ................. G01B 7/30 324/207.15 |
| 2008/0087858 | A1* | 4/2008 | Hatsuzawa | .......... G01D 5/2073 251/129.11 |
| 2008/0164869 | A1 | 7/2008 | Bach et al. | |
| 2012/0304964 | A1* | 12/2012 | Nemoto | ..................... F02D 9/10 123/399 |
| 2013/0068978 | A1* | 3/2013 | Hiranuma | ............. F02D 11/106 251/129.12 |
| 2013/0127449 | A1* | 5/2013 | Backes | ................ G01D 5/2291 324/207.18 |
| 2018/0238714 | A1* | 8/2018 | Leidich | ................ G01D 5/2026 |

FOREIGN PATENT DOCUMENTS

| | | |
|---|---|---|
| DE | 91 05 145.2 U1 | 10/1995 |
| DE | 197 38 836 A1 | 3/1999 |
| DE | 10 2007 037 217 A1 | 2/2009 |
| EP | 1 083 408 A2 | 3/2001 |
| EP | 1 975 570 A2 | 3/2008 |

* cited by examiner

SENSOR ARRANGEMENT FOR THE CONTACTLESS SENSING OF ANGLES OF ROTATION ON A ROTATING PART

This application is a 35 U.S.C. § 371 National Stage Application of PCT/EP2015/072370, filed on Sep. 29, 2015, which claims the benefit of priority to Serial No. DE 10 2014 220 454.2, filed on Oct. 9, 2014 in Germany, the disclosures of which are incorporated herein by reference in their entirety.

The present disclosure is directed to a sensor arrangement for the contactless sensing of angles of rotation according to definition of the species in independent patent claim 1.

Various inductive rotational angle sensors are known from the related art. The coupling between an exciter coil and one or multiple sensor coils is largely influenced by the rotational angle position of a coupling element (target). The evaluation of coupling factors requires complex electronics. The shape of the rotational angle signal profile is generally highly dependent on the geometry and arrangement of the sensor coils and targets used.

DE 197 38 836 A1 describes, for example, an inductive angle sensor including a stator element, a rotor element, and an evaluation circuit. The stator element has an exciter coil which is subjected to a periodic AC voltage, and multiple receiving coils. The rotor element specifies the intensity of the inductive coupling between the exciter coil and the receiving coils, as a function of its angular position relative to the stator element. The evaluation circuit determines the angular position of the rotor element relative to the stator element, from the voltage signals induced in the receiving coils.

SUMMARY

In contrast, the sensor arrangement according to the present disclosure for the contactless sensing of angles of rotation having the features of independent patent claim 1 has the advantage that the measurement of an angle of rotation is possible by determining the inductance of a plurality of individual coils, preferably three or six circularly arranged coils. Advantageously, the evaluation and control unit generates evaluation signals having a signal profile which is very similar to a three-phase sinusoidal signal, so that the evaluation is possible using simple algorithms. The individual detection coils show a specific geometry.

A three-phase sinusoidal signal profile has the advantage that the angle of rotation may be deduced (Scott-T transformation) from the measured inductances of the individual detection coils using comparatively simple calculation specifications. Advantageously, the consideration of mechanical tolerances, for example, offset or tilt of the target, is implementable via the simple mathematical relationships. Sine, cosine, and/or tangent functions, as well as their inverse functions, may be processed relatively simply using a microcontroller which is part of the evaluation and control unit.

The three-phase signal profile is achieved via a circular arrangement of three or six coils. Depending on the number of metal surfaces of the target, a periodicity of 90° or 180° is obtained. Thus, a periodicity of 90° may be implemented if the target has four metal surfaces. If the target has only two metal surfaces, a periodicity of 180° may be implemented.

In order to obtain a sinusoidal signal, the geometry of the coil is correspondingly adjusted. Embodiments of the sensor arrangement according to the present disclosure include a coil arrangement in which the spacing between the conducting paths of the individual windings of the detection coils or coil sections is adjusted in such a way that sweeping the metal surfaces of the target causes the inductance of the coil to change in such a way that a sinusoidal profile of the rotational angle signal results.

Exemplary embodiments of the present disclosure provide a sensor arrangement for the contactless sensing of angles of rotation on a rotating part which is coupled with a disk-shaped target which has at least one metal surface, and which generates at least one piece of information for ascertaining the instantaneous angle of rotation of the rotating part, in connection with a coil arrangement which has at least one flat detection coil. According to the present disclosure, the coil arrangement includes three flat detection coils which are uniformly distributed on the circumference of a circle, and the rotating target includes at least two metal surfaces which influence the inductances of the flat detection coils due to eddy current effects, as a function of the degree of overlap, wherein an evaluation and control unit generates essentially sinusoidal evaluation signals which represent the changes in inductance in the detection coils, and evaluates them for calculating the angle of rotation.

Advantageous improvements on the sensor arrangement for the contactless sensing of angles of rotation specified in the independent claim 1 are possible via the measures and refinements listed in the dependent claims.

It is particularly advantageous that each of the flat detection coils may have two coil sections having an opposite winding sense, which may be arranged opposite one another on the circumference of the circle. Due to the opposite winding sense of the two coil sections, advantageous EMC characteristics result with respect to emission and the coupling-in of interference signals. In addition, the opposite arrangement of the coil sections on a circular circumference results in low sensitivity with respect to assembly tolerances.

In one advantageous embodiment of the sensor arrangement according to the present disclosure, the flat coil sections may be designed as uniform circle segments and/or annular segments having a predefined opening angle. In the case of the use of three flat detection coils, the opening angle of the flat detection coils preferably has a value in the range of 100° to 120° in each case. In the case of the use of three distributed detection coils, the opening angle of the flat coil sections has a value in the range of 50° to 60° in each case.

In an additional advantageous embodiment of the sensor arrangement according to the present disclosure, a spacing between two conducting path sections, which extend in a circular arc shape, of the individual detection coil or coil section, may be chosen to be as small as possible, and a spacing between two radially extending conducting path sections of the individual detection coil or coil section may be chosen in such a way that the radially extending conducting path sections are distributed as uniformly as possible over the available surface of the individual detection coil or coil section. As a result, a sufficiently high inductance for the individual detection coils or coil sections may be achieved, whereby the detection and evaluation of the changes in inductance may be facilitated in an advantageous manner.

In an additional advantageous embodiment of the sensor arrangement according to the present disclosure, the metal surfaces may be designed as uniform circle segments and/or annular segments having a predefined opening angle. The opening angle of the metal surfaces may have a value in the range from 50° to 120° in each case, as a function of the number of metal surfaces.

To generate three phase-shifted essentially sinusoidal evaluation signals, the associated target may, for example, have four metal surfaces which are arranged uniformly distributed on the circumference of a circle, each having an opening angle of 60°. The evaluation and control unit generates three phase-shifted, essentially sinusoidal evaluation signals from the changes in inductance in the three detection coils effected by the rotational movement of the target, and evaluates them for calculating the angle of rotation in an unambiguous range of 90°. In order to increase the unambiguous range to 180°, the target may have two metal surfaces arranged opposite one another on the circumference of a circle, each having an opening angle of 120°, wherein the evaluation and control unit generates three phase-shifted, essentially sinusoidal evaluation signals from the changes in inductance in the three detection coils effected by the rotational movement of the target, and evaluates them for calculating the angle of rotation in an unambiguous range of 180°.

Exemplary embodiments of the present disclosure are illustrated in the drawings and are described in greater detail in the description below. In the drawings, identical reference numerals refer to components or elements which carry out identical or similar functions.

DETAILED DESCRIPTION

As is apparent from FIGS. 1 to 8, the depicted exemplary embodiment of a sensor arrangement 1, 1A according to the present disclosure for the contactless sensing of angles of rotation on a rotating part each include a target 20, 20A coupled with the rotating part, which has an annular disk-shaped base body 22, 22A with at least one metal surface 24, 24A, and a coil arrangement 40, 40A with at least one flat detection coil 42, 44, 46, 42A, 44A, 46A, which is arranged on a round printed circuit board 30, 30A. In connection with the coil arrangement 40, 40A, the target 20, 20A generates at least one piece of information for ascertaining the instantaneous angle of rotation of the rotating part. According to the present disclosure, the coil arrangement 40, 40A includes three flat detection coils 42, 44, 46, 42A, 44A, 46A which are uniformly distributed on the circumference of a circle, and the rotating target 20, 20A comprises at least two metal surfaces 24, 24A which influence the inductances of the flat detection coils 42, 44, 46, 42A, 44A, 46A due to eddy current effects, as a function of the degree of overlap. In this case, an evaluation and control unit 10 generates essentially sinusoidal evaluation signals K1, K2, K3, K1A, K2A, K3A, which represent the changes in inductance in the detection coils 42, 44, 46, 42A, 44A, 46A, and evaluates them for calculating the angle of rotation. The evaluation signals K1, K2, K3, K1A, K2A, K3A are described in greater detail below with reference to FIGS. 3 and 8.

As is furthermore apparent from FIGS. 1 to 8, the coil arrangement 40, 40A in the depicted embodiment is arranged on a round printed circuit board 30, 30A and is electrically connected to an evaluation and control unit 10. Of course, the printed circuit board 30, 30A does not have to be round; the printed circuit board 30, 30A may also have another suitable shape. The annular disk-shaped base body 22, 22A of the target 20, 20A, which is depicted as transparent in the drawings, is arranged at a predefined constant axial distance above or below the printed circuit board 30, 30A. In the depicted exemplary embodiments, the rotating part, which is not depicted in detail, may be a shaft which, having sufficient lateral play, is routed through the circular opening in the printed circuit board 30, 30A, and is connected to the base body 22, 22A of the target 20, 20A in a rotationally fixed manner.

Figure 1:
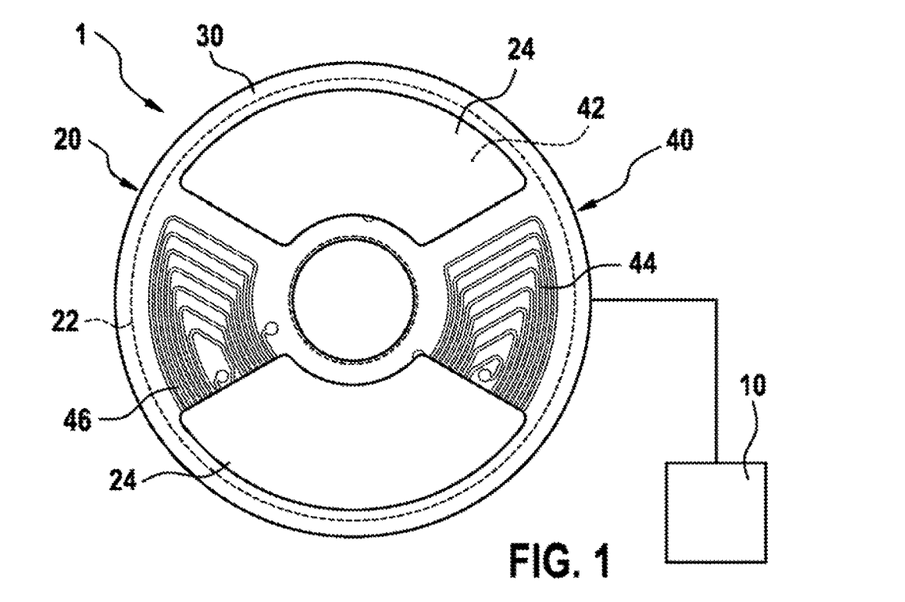
FIG. 1 shows a schematic top view of a first exemplary embodiment of a sensor arrangement according to the present disclosure for the contactless sensing of angles of rotation.
Figure 2:
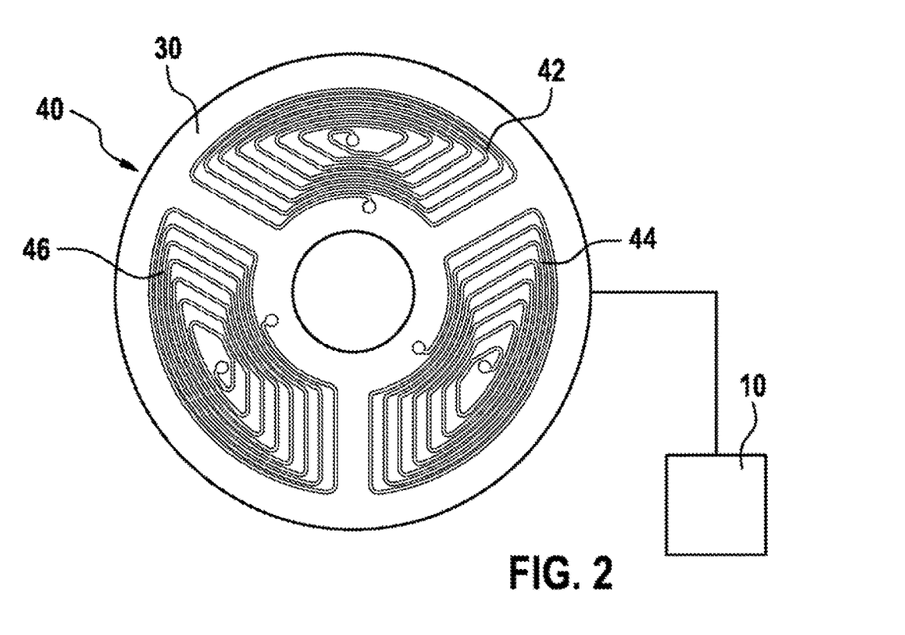
FIG. 2 shows a schematic top view of a first exemplary embodiment of a coil arrangement for the sensor arrangement according to the present disclosure from FIG. 1.
Figure 3:
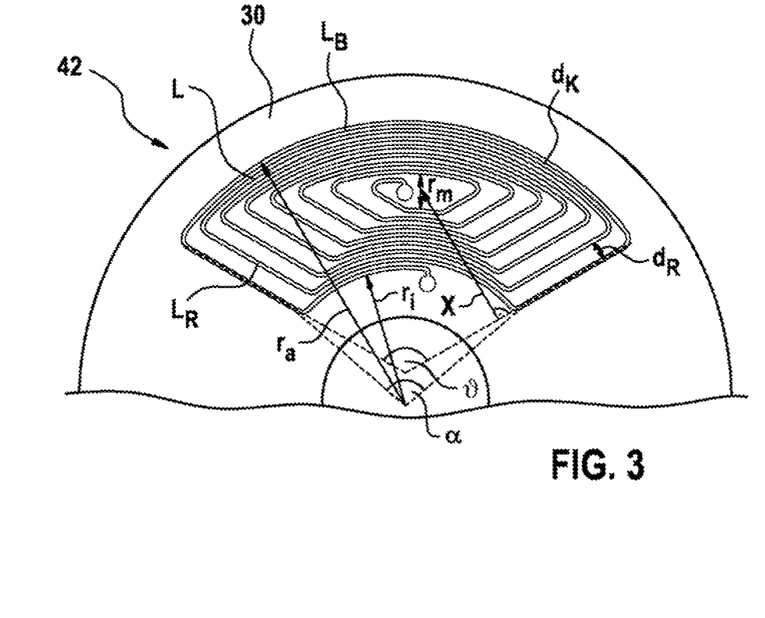
FIG. 3 shows a schematic top view of a detection coil for the coil arrangement from FIG. 2.

As is furthermore apparent from FIGS. 1 to 3, the first exemplary embodiment of the coil arrangement 40 includes three detection coils 42, 44, 46 which are arranged in a distributed manner over the circumference of the circular coil arrangement 40. As is furthermore apparent from FIG. 1, the target 20 of the depicted first exemplary embodiment of the sensor arrangement 1 according to the present disclosure includes two annular segment-shaped metal surfaces 24, each having an opening angle with a value in the range of 100° to 120°. As is apparent in particular from FIG. 2, the flat detection coils 42, 44, 46 are designed as uniform annular segments having a predefined opening angle which has a value in the range of 100° to 120°.

As is furthermore apparent from FIG. 3, conducting paths L having the thickness B, which form the respective winding of the associated detection coil 42, 44, 46, of which a first detection coil 42 is depicted by way of example, have circular arc-shaped conducting path sections $L_B$ and radially extending conducting path sections $L_R$. A spacing $d_K$, which the conducting path sections $L_R$, which extend in a circular arc shape, have with respect to one another, is preferably chosen to be as small as possible in order to accommodate as many coil windings N as possible on the available surface of the detection coil 42, 44, 46. The maximum number N of coil windings may be approximately calculated using equation (1).

$$N \approx \frac{\frac{1}{2}(r_a - r_i - r_m) + d_k}{B + d_k} \quad (1)$$

Here, $r_a$ denotes an outer radius, $r_i$ denotes an inner radius of the corresponding detection coil 42, 44, 46, $r_m$ denotes a radial expansion of a free surface in the center of the corresponding coil 42, 44, 46, and B denotes the conducting path width. Both the minimum conducting path width B and the minimum spacing $d_K$ between two circular arc-shaped conducting path sections $L_B$ are, for example, 125 μm. The values for the remaining variables are, for example, $r_a$=8.35 mm, $r_i$=4 mm, and $r_m$=0.75 mm. Using the above formula, a winding count of N=7.7 results for the depicted exemplary embodiment.

The spacing $d_R$ of the radially extending conducting path sections $L_R$ is chosen in such a way that the radially extending conducting path sections $L_R$ are distributed as uniformly as possible over the entire available surface of the corresponding detection coil 42, 44, 46. The suitable conducting path spacing $d_R$ may be approximately calculated using equation (2).

$$d_R = \frac{X}{N} - B \quad (2)$$

In the depicted first exemplary embodiment, the spacing $d_R$ is, for example, 480 μm. A length X representing the perpendicular spacing between the center of the coil and the outermost radial conducting path sections $L_R$ may be determined using equation (3).

$$X = \frac{1}{2}(r_i + r_a) \cdot \sin\left(\frac{1}{2}\vartheta\right) - r_i \cdot \sin\left(\frac{1}{2}(\vartheta - \alpha)\right) \quad (3)$$

Here, θ denotes the angle formed by the radially extending conducting path sections $L_R$ of the left and right coil halves; α denotes the opening angle of the circular conducting path sections $L_R$. In the depicted first exemplary embodiment of the coil arrangement 40, θ=120° and α=100°.

Figure 4:
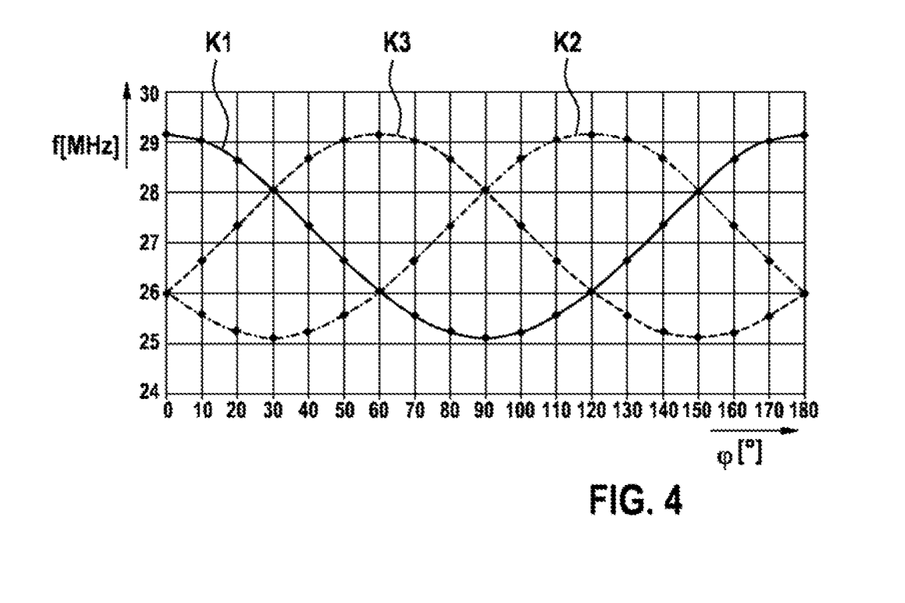
FIG. 4 shows a characteristic curve diagram of the evaluation signals generated by the sensor arrangement according to the present disclosure for the contactless sensing of angles of rotation from FIG. 1.

As is apparent from the associated characteristic curve diagram according to FIG. 4, the three generated phase-shifted evaluation signals K1, K2, K3 run in an approximately sinusoidal manner, wherein the evaluation and control unit 10 generates a first evaluation signal K1 by evaluating the first detection coil 42, generates a second evaluation signal K2 by evaluating the second detection coil 44, and generates a third evaluation signal K3 by evaluating the third detection coil 46. FIG. 1 shows, by way of example, the position of the target 20 at an angle of rotation of 0°, where the determination results by definition. The opening angles of the detection coils 42, 44, 46 are each 100°, and the opening angles of the metal surfaces 24 of the target 20 are each 120°. Due to the use of only two metal surfaces 24, the rotational angle measuring range is 180°. In the depicted characteristic curve diagram according to FIG. 4, a resonant frequency is plotted along the perpendicular axis, which changes due to the change in inductance in the respective detection coil 42, 44, 46. Of course, other suitable measurable physical variables may also be used in order to detect and depict a change in inductance in the respective detection coil 42, 44, 46.

Figure 5:
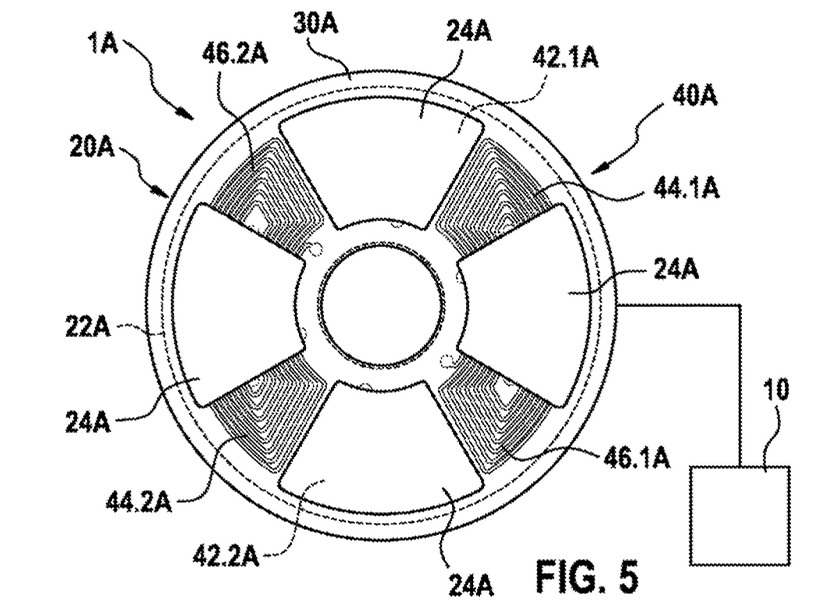
FIG. 5 shows a schematic top view of a second exemplary embodiment of a sensor arrangement according to the present disclosure for the contactless sensing of angles of rotation.
Figure 6:
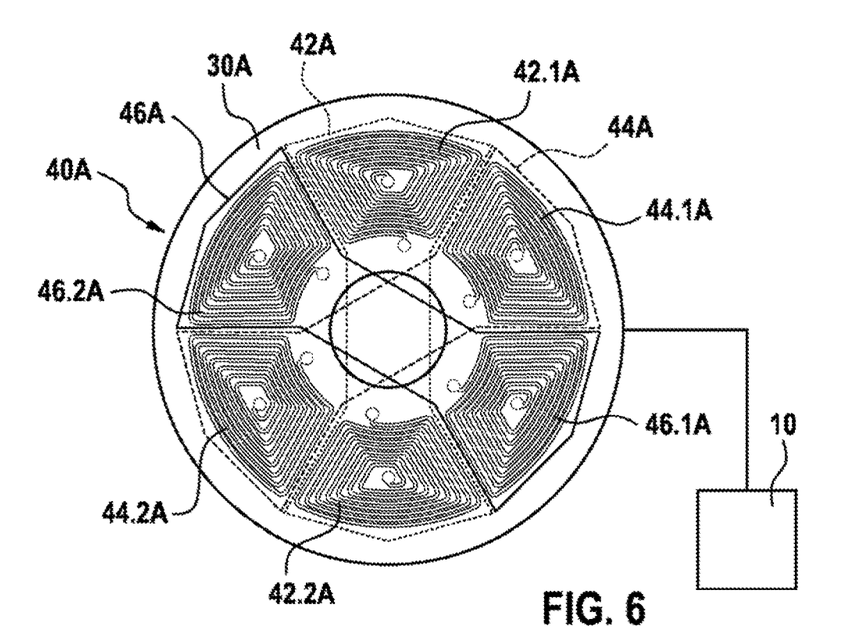
FIG. 6 shows a schematic top view of a second exemplary embodiment of a coil arrangement for the sensor arrangement according to the present disclosure from FIG. 5.
Figure 7:
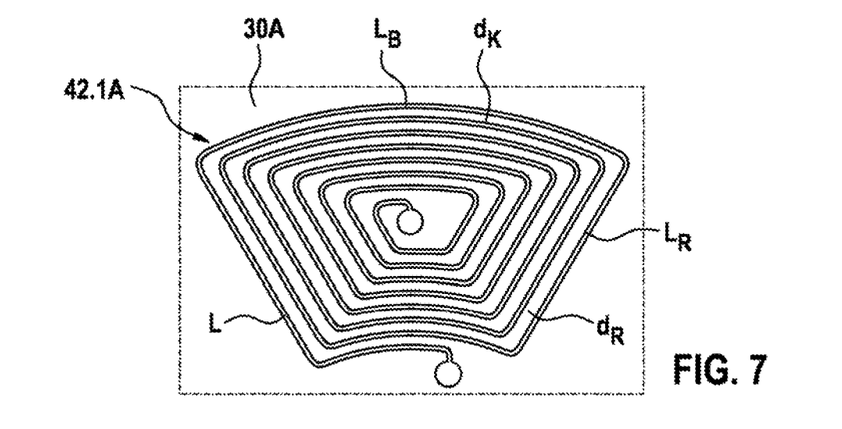
FIG. 7 shows a schematic top view of a detection coil for the coil arrangement from FIG. 6.

As is furthermore apparent from FIGS. 5 to 7, the second exemplary embodiment of the coil arrangement 40A includes three detection coils 42A, 44A, 46A which are arranged in a distributed manner over the circumference of the circular coil arrangement 40A, each being divided into two coil sections 42.1A, 42.2A, 44.1A, 44.2A, 46.1A, 46.2A. Thus, a total of six coil sections 42.1A, 42.2A, 44.1A, 44.2A, 46.1A, 46.2A are uniformly arranged in a distributed manner over the circumference of the circular coil arrangement 40A. The two coil sections 42.1A, 42.2A, 44.1A, 44.2A, 46.1A, 46.2A of the respective detection coils 42A, 44A, 46A are each arranged in a distributed manner over the circumference of the circular coil arrangement 40A in such a way that lateral positional tolerances are compensated for, to a first approximation. In the depicted second exemplary embodiment, the two coil sections 42.1A, 42.2A, 44.1A, 44.2A, 46.1A, 46.2A of the respective detection coils 42A, 44A, 46A are arranged opposite one another on the circumference of the circular coil arrangement 40A. The winding sense of the two coil sections 42.1A, 42.2A, 44.1A, 44.2A, 46.1A, 46.2A of the respective detection coils 42A, 44A, 46A is opposite, so that the magnetic field at a distance of approximately three coil diameters is very small, and the coupling-in of interference signals may be compensated for.

As is apparent in particular from FIG. 6, the flat coil sections 42.1A, 42.2A, 44.1A, 44.2A, 46.1A, 46.2A are each designed as uniform annular segments having a predefined opening angle of 50°. In the depicted exemplary embodiments, a first detection coil 42A is made up of the two flat coil sections 42.1A and 42.2A; a second detection coil 44A is made up of the two coil sections 44.1A and 44.2A, and a third detection coil 46A is made up of the two flat coil sections 46.1A and 46.2A.

As is furthermore apparent from FIG. 5, the target 20A of the depicted second exemplary embodiment sensor arrangement 1A according to the present disclosure for the contactless sensing of angles of rotation on a rotating part includes four annular segment-shaped metal surfaces 24A having an opening angle of 60°. FIG. 5 shows, by way of example, the position of the targets 20A at an angle of rotation of 0°, wherein the determination takes place by definition. It is apparent that a shift of the center point of the target 20A in the positive y-direction (orientation corresponding to the page surface) results in an enlargement of the overlap of the second coil section 46.2A of the third detection coil 46A and in a reduction in the overlap of the first coil section 46.1A of the third detection coil 46A. The same relationship applies to the coil sections 44.1A and 44.2A of the second detection coil 44A. In this position of the target 20A, the relationship does not apply to the coil sections 42.1A and 42.2A of the first detection coil 42A, since there is generally no effect on these coil sections 42.1A, 42.2A due to a slight (<5% of the diameter) shift of the target 20A in the y-direction, due to a larger design of the target 20A in the radial direction.

It is possible to measure the inductance of the six coil sections 42.1A and 42.2A, 44.1A and 44.2A, and 46.1A and 46.2A separately, and to carry out the correction corresponding to the following specification, where $L_m$ represents the calculated average value of the inductance of the coil section, which results from the measured inductances of the coil sections 42.1A, 42.2A, 44.1A, 44.2A, 46.1A, 46.2A of the respective detection coil 42A, 44A, 46A and which may be determined according to equation (4). Here, L1 and L2 each represent the measured inductance of the corresponding coil sections 42.1A, 42.2A, 44.1A, 44.2A, 46.1A, 46.2A.

$$L_m = (L1+L2)/2 \quad (4)$$

The calculation may take place in the evaluation and control unit 10. In the depicted second exemplary embodiment, the two coil sections 42.1A, 42.2A, 44.1A, 44.2A, 46.1A, 46.2A of the detection coils 42A, 44A, 46A are electrically connected in series. Since the coupling factors between the coil sections 42.1A, 42.2A, 44.1A, 44.2A, 46.1A, 46.2A are relatively small, with k<0.02, the inductances are additive. The formation of the average thus takes place in a virtually "analog" manner, without computing effort. In addition, the number of connections between the coil arrangement 40A and the evaluation and control unit 10 is reduced. To reduce the susceptibility to interference and to reduce the field emissions, each of the coil sections 42.1A, 42.2A, 44.1A, 44.2A, 46.1A, 46.2A is wound in the opposite sense, as already indicated above. As a result, the far-field magnetic field strength is reduced. Assuming a homogeneous interference field, equal voltages having a different sign in each case are induced in the two coil sections 42.1A, 42.2A, 44.1A, 44.2A, 46.1A, 46.2A. Due to the series connection, the two voltages ideally offset each other at zero.

As is furthermore apparent from FIG. 7, conducting paths L having the thickness B, which form the respective winding of the coil sections 42.1A, 42.2A, 44.1A, 44.2A, 46.1A, 46.2A of the detection coils 42A, 44A, 46A, of which a first coil section 42.1A of the first detection coil 42A is depicted by way of example, have circular arc-shaped conducting path sections $L_B$ and radially extending conducting path sections $L_R$, similarly to the first exemplary embodiment. A spacing $d_K$, which the conducting path sections $L_B$, which extend in a circular arc shape, have with respect to one another, is preferably chosen to be as small as possible in order to as many coil windings N as possible on the available surface of the coil section 42.1A, 42.2A, 44.1A, 44.2A, 46.1A, 46.2A. The maximum number N of coil windings may be approximately calculated using equation (1). Similarly to the first exemplary embodiment, both the minimum conducting path width B and the minimum spacing $d_K$ between two circular arc-shaped conducting path sections $L_B$ are, for example, 125 µm. The values for the remaining variables are, for example, $r_a$=8.35 mm, $r_i$=4 mm, and $r_m$=0.75 mm. Similarly to the first exemplary embodiment, a winding count of N=7.7 results for the coil sections 42.1A, 42.2A, 44.1A, 44.2A, 46.1A, 46.2A.

Similarly to the first exemplary embodiment, the spacing $d_R$ of the radially extending conducting path sections $L_R$ is chosen in such a way that the radial radially extending conducting path sections $L_R$ are distributed as uniformly as possible over the entire available surface of the corresponding coil section 42.1A, 42.2A, 44.1A, 44.2A, 46.1A, 46.2A. The suitable conducting path spacing $d_R$ may also be approximately calculated using equation (2). In the depicted second exemplary embodiment, the spacing $d_R$ is, for example, 230 µm. In addition, in the depicted second exemplary embodiment of the coil arrangement 40A, θ=60° and α=50°.

Figure 8:
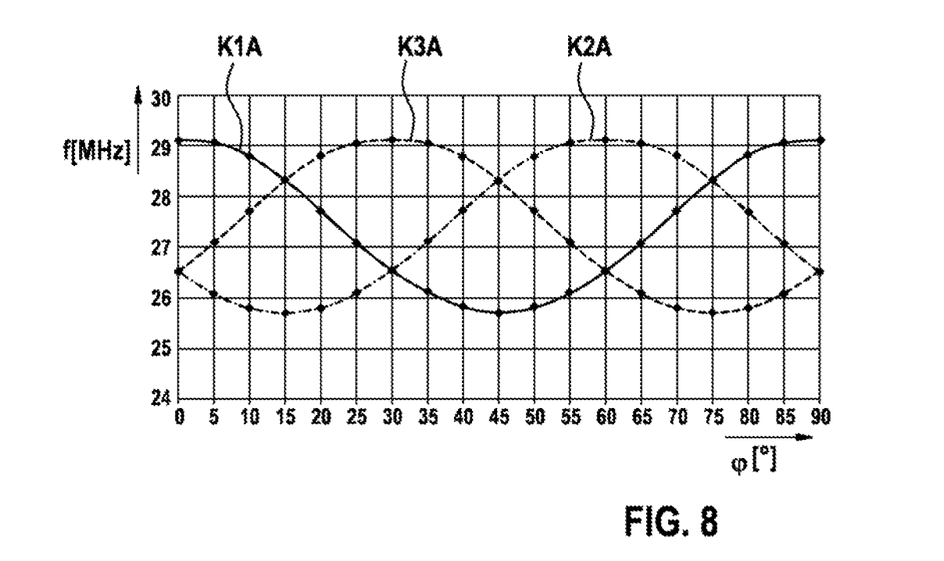
FIG. 8 shows a characteristic curve diagram of the evaluation signals generated by the sensor arrangement according to the present disclosure for the contactless sensing of angles of rotation from FIG. 5.

As is apparent from the associated characteristic curve diagram according to FIG. 8, the three generated phase-shifted evaluation signals K1A, K2A, K3A run in an approximately sinusoidal manner, similarly to the first exemplary embodiment, wherein the evaluation and control unit 10 generates a first evaluation signal K1A by evaluating the first detection coil 42A having the coil sections 42.1A and 42.2A, generates a second evaluation signal K2A by evaluating the second detection coil 44A having the coil sections 44.1A and 44.2A, and generates a third evaluation signal K3A by evaluating the third detection coil 46A having the coil sections 46.1A and 46.2A. In addition, a symmetry exists between the coil sections 42.1A and 42.2A, 44.1A and 44.2A, and 46.1A and 46.2A. In the case of an exactly central position of the target 20A with respect to the coil arrangement 40A, there is no difference between the respective partners and the evaluation signals K1A, K2A, K3A. Due to the use of four metal surfaces 24A, the rotational angle measuring range is 90°. Similarly to the characteristic curve diagram according to FIG. 4, in the characteristic curve diagram depicted in FIG. 8, a resonant frequency is plotted along the perpendicular axis, which changes due to the change in inductance in the respective detection coil 42A, 44A, 46A. Of course, other suitable measurable physical variables may also be used in order to detect and depict a change in inductance in the respective detection coil 42A, 44A, 46A.

The invention claimed is:

1. A sensor arrangement for the contactless sensing of angles of rotation on a rotating part, the sensor arrangement comprising:
    a disk-shaped target coupled to the rotating part, the disk-shaped target having at least one metal surface and configured to generate at least one piece of information for ascertaining an instantaneous angle of rotation of the rotating part, in connection with a coil arrangement;
    the coil arrangement having at least one flat detection coil; and
    an evaluation and control unit operable to generate sinusoidal evaluation signals, the signals representing the changes in inductance of the at least one flat detection coil and further operable to evaluate the signals in order to calculate the angle of rotation,
    wherein the coil arrangement includes three flat detection coils uniformly distributed on the circumference of a circle, and
    wherein the disk-shaped target includes at least two metal surfaces configured to influence the inductances in the flat detection coils due to eddy current effects, as a function of a degree of overlap.

2. The sensor arrangement as claimed in claim 1, wherein each of the flat detection coils has two coil sections having an opposite winding sense, the coil sections being arranged opposite one another on the circumference of the circle.

3. The sensor arrangement as claimed in claim 2, wherein the opposite winding sense of the each of the flat detection coils are configured to provide EMC characteristics with respect to emission and coupling-in of interference signals.

4. The sensor arrangement as claimed in claim 2, wherein the two coil sections are further arranged in a distributed manner over the circumference of the circular coil arrangement so that lateral positional tolerances are compensated for.

5. The sensor arrangement as claimed in claim 2, wherein the winding sense of the two coil sections is arranged opposite to one another so that magnetic field at a distance of approximately three coil diameters is minimum and a coupling-in of interference signals are compensated for.

6. The sensor arrangement as claimed in claim 1, wherein the target includes two metal surfaces arranged opposite one another on the circumference of the circle, each of the metal surfaces having an opening angle with a value in the range of 100° to 120°.

7. The sensor arrangement as claimed in claim 1, wherein the metal surfaces are configured as at least one of (i) uniform circle segments and (ii) annular segments having a predefined opening angle.

8. The sensor arrangement as claimed in claim 7, wherein the opening angle of each of the metal surfaces has a value in the range of 50° to 120°.

9. The sensor arrangement as claimed in claim 1, wherein at least one of (i) the flat detection coils and (ii) the flat coil sections are configured as at least one of (i) uniform circle segments and (ii) annular segments having a predefined opening angle.

10. The sensor arrangement as claimed in claim 9, wherein the opening angle of each of the flat detection coils has a value in the range of 100° to 120°.

11. The sensor arrangement as claimed in claim 9, wherein the opening angle of each of the flat coil sections has a value in the range of 50° to 60°.

12. The sensor arrangement as claimed in claim 9, wherein a spacing between two conducting path sections of each of the flat detection coils or each of the flat coil sections is configured to be minimum, the conducting path sections extending in a circular arc shape and
wherein a spacing between two radially extending conducting path sections of each of the flat detection coils or each of the flat coil sections is configured such that the radially extending conducting path sections are distributed to be uniform over the available surface of each of the flat detection coils or each of the flat coil sections.

13. The sensor arrangement as claimed in claim 12, wherein the spacing between the two conducting path sections of each of the flat detection coils or each of the flat coil sections and the spacing between the two radially extending conducting path sections of each of the flat detection coils or each of the flat coil sections are further configured to provide a high inductance for the at least one flat detection coil or flat coil sections.

14. The sensor arrangement as claimed in claim 1, wherein the target includes four metal surfaces uniformly distributed on the circumference of the circle, each of the metal surfaces having an opening angle with a value in the range of 50° to 60°.

15. The sensor arrangement as claimed in claim 1, wherein the evaluation and control unit are further configured to generate the sinusoidal evaluation signals which are three phase-shifted.

16. The sensor arrangement as claimed in claim 15, wherein the evaluation and control unit are further configured to evaluate the sinusoidal evaluation signals in order to calculate the angle of rotation in an unambiguous range of 180°.

17. A sensor arrangement for the contactless sensing of angles of rotation on a rotating part, the sensor arrangement comprising:
a disk-shaped target coupled to the rotating part, the disk-shaped target having at least one metal surface and configured to generate at least one piece of information for ascertaining an instantaneous angle of rotation of the rotating part, in connection with a coil arrangement;
the coil arrangement having at least one flat detection coil; and
an evaluation and control unit operable to generate sinusoidal evaluation signals, the signals representing the changes in inductance of the at least one flat detection coil and further operable to evaluate the signals in order to calculate the angle of rotation,
wherein the coil arrangement includes three flat detection coils uniformly distributed on the circumference of a circle,
wherein the disk-shaped target includes at least two metal surfaces configured to influence the inductances in the flat detection coils due to eddy current effects, as a function of a degree of overlap,
wherein a spacing between two conducting path sections of each of the flat detection coils or each of the flat coil sections is configured to be minimum, the conducting path sections extending in a circular arc shape, and
wherein a spacing between two radially extending conducting path sections of each of the flat detection coils or each of the flat coil sections is configured such that the radially extending conducting path sections are distributed to be uniform over the available surface of each of the flat detection coils or each of the flat coil sections.

18. A sensor arrangement for the contactless sensing of angles of rotation on a rotating part, the sensor arrangement comprising:
a disk-shaped target coupled to the rotating part, the disk-shaped target having at least one metal surface and configured to generate at least one piece of information for ascertaining an instantaneous angle of rotation of the rotating part, in connection with a coil arrangement;
the coil arrangement having at least one flat detection coil; and
an evaluation and control unit operable to generate sinusoidal evaluation signals, the signals representing the changes in inductance of the at least one flat detection coil and further operable to evaluate the signals in order to calculate the angle of rotation,
wherein the coil arrangement includes three flat detection coils uniformly distributed on the circumference of a circle,
wherein the disc-shaped target includes at least two metal surfaces configured to influence the inductances in the flat detection coils due to eddy current effects, as a function of a degree of overlap,
wherein at least one of (i) the flat detection coils and (ii) the flat coil sections are configured as at least one of (i) uniform circle segments and (ii) annular segments having a predefined opening angle and the opening angle of each of the flat detection coils has a value in the range of 100° to 120°, and
wherein the target includes two metal surfaces arranged opposite one another on the circumference of the circle, each of the metal surfaces having an opening angle with a value in the range of 100° to 120°.

* * * * *